United States Patent
Jiang et al.

(10) Patent No.: US 6,740,821 B1
(45) Date of Patent: May 25, 2004

(54) SELECTIVELY CONFIGURABLE CIRCUIT BOARD

(75) Inventors: Tongbi Jiang, Boise, ID (US); David Kao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/086,956

(22) Filed: Mar. 1, 2002

(51) Int. Cl.[7] ............................................... H05K 1/16
(52) U.S. Cl. ..................... 174/260; 174/257; 361/781; 361/777; 361/832; 200/243; 200/266
(58) Field of Search ........................... 174/255, 257, 174/260; 361/124, 131, 189, 781, 777, 832; 200/42.02, 239, 243, 266

(56) References Cited

U.S. PATENT DOCUMENTS

| | | | |
|---|---|---|---|
| 3,778,576 A | * 12/1973 | Anderson et al. | ........... 200/264 |
| 4,228,412 A | * 10/1980 | Dalley et al. | ................ 335/152 |
| 4,275,432 A | * 6/1981 | Napiorkowski | ............. 361/124 |
| 4,276,458 A | * 6/1981 | Alter | ........................... 200/245 |
| 4,409,295 A | * 10/1983 | Smith, III et al. | ........... 428/591 |
| 4,457,780 A | * 7/1984 | Osada et al. | ................... 75/236 |
| 4,617,723 A | 10/1986 | Mukai | |
| 4,937,475 A | 6/1990 | Rhodes et al. | |
| 4,950,846 A | * 8/1990 | Pollard | ....................... 200/16 A |
| 5,153,507 A | 10/1992 | Fong et al. | |
| 5,182,538 A | * 1/1993 | Muller | ........................ 337/102 |
| 5,321,322 A | 6/1994 | Verheyen et al. | |
| 5,377,124 A | 12/1994 | Mohsen | |
| 5,451,811 A | 9/1995 | Whitten et al. | |
| 5,717,257 A | * 2/1998 | Hofsass | ....................... 307/117 |
| 5,747,868 A | 5/1998 | Reddy et al. | |
| 5,953,216 A | 9/1999 | Farnworth et al. | |
| 5,973,283 A | * 10/1999 | Ariga et al. | ................. 200/512 |
| 6,054,334 A | 4/2000 | Ma | |
| 6,081,463 A | 6/2000 | Shaffer et al. | |
| 6,240,535 B1 | 5/2001 | Farnworth et al. | |
| 6,313,658 B1 | 11/2001 | Farnworth et al. | |
| 6,324,103 B2 | 11/2001 | Hiraki et al. | |

* cited by examiner

Primary Examiner—Kamand Cuneo
Assistant Examiner—Jose H. Alcala
(74) Attorney, Agent, or Firm—Perkins Coie LLP

(57) ABSTRACT

Embodiments of the invention provide thermally actuatable switches and selectively configurable circuit boards which may employ such switches. A circuit board of one embodiment includes a substrate having board leads and a plurality of electrical connectors arranged adjacent a component site. Selectively configurable circuitry may be carried by the substrate and adapted to selectively couple selected ones of the electrical connectors to selected ones of the board leads. One or more trace may be associated with each of the electrical connectors and one or more of these traces may include a thermally actuatable switch that can be selectively closed. The thermally actuatable switch may comprise a gap between two conductive lengths of the conductive trace, an exposed switch surface, and a thermally responsive member that may wet the exposed switch surface when selectively heated above an activation temperature.

10 Claims, 6 Drawing Sheets

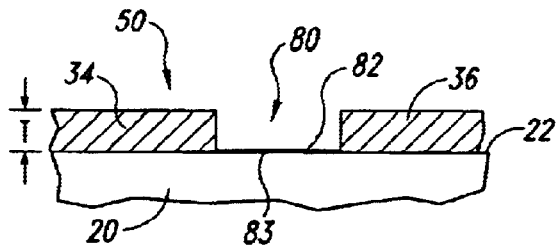
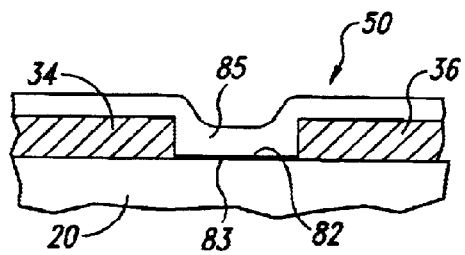
*Fig. 4A*  *Fig. 4B*
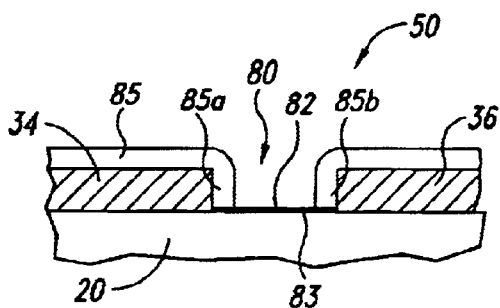
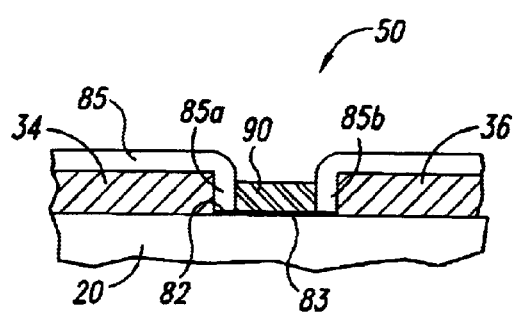
*Fig. 4C*  *Fig. 4D*
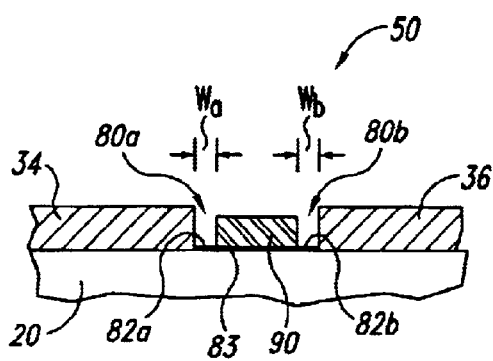
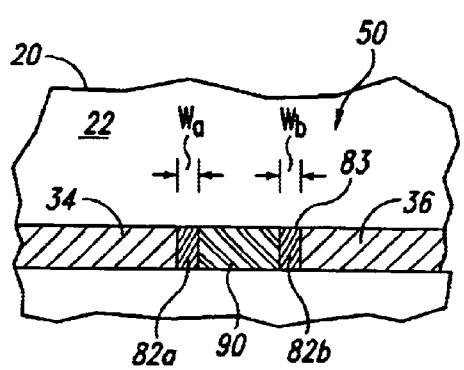
*Fig. 4E*  *Fig. 4F*

SELECTIVELY CONFIGURABLE CIRCUIT BOARD

TECHNICAL FIELD

The present invention provides certain improvements in microelectronic device assemblies. The invention has particular utility in connection with configuring circuit boards for use with different microelectronic components or different configurations of microelectronic components

BACKGROUND

The microelectronic device industry is highly competitive. To maintain a competitive edge, manufacturers must be able to quickly adapt their product lines to advancing technology and changing consumer demands. Many microelectronic products require a number of separate components, one or more of which must be dedicated to a particular product design. If a manufacturer orders an inventory of w microelectronic components dedicated to one particular product, the inventory may have to be discarded or sold well below cost if sales of the product fall short of projected levels.

The memory module industry illustrates the difficulties inherent in, predicting the market and minimizing manufacturing costs. Many computers and other processor-based systems employ either Single In-line Memory Modules (SIMMs) or Dual In-line Memory Modules (DIMMs). SIMMs and DIMMs each generally comprise a circuit board with a plurality of integrated circuit dies mounted thereon. The dies are often interchangeable and can be used on a wide variety of different SIMM or DIMM configurations. The circuit boards, however, are commonly specific to a particular SIMM or DIMM configuration. Manufacturer will order or produce an inventory of circuit boards for a particular SIMM or DIMM configuration. If market demands for that particular configuration fall short of projected demands, the manufacturer will be unable to use the inventory of specialized circuit boards for another memory module product. Oftentimes, if the manufacturer overestimates the demand for a particular memory module configuration, the demand for an alternative configuration will be underestimated. It can sometimes take weeks to redesign and stock an alternative configuration, leading to production delays and backlogs in customer orders.

U.S. Pat. No. 5,377,124 (Mohsen, the teachings of which are incorporated herein by reference) suggests a field programmable printed circuit board which employs a relatively complex, multi-layered circuit board and a specialized integrated circuit die, or "programmable interconnect chip," mounted on the circuit board. The programmable interconnect chip includes circuitry which will route connections between the conductive traces provided on the rest of the circuit board. Ostensibly, by replacing one programmable interconnect chip with a different programmable interconnect chip, the circuit board can be adapted for different uses. Unfortunately, designing and producing such specialized integrated circuit dies can be a relatively expensive, time-onsuming process. With some lower profit margin products, e.g., standard memory modules, the cost of such a specialized die may well outweigh the potential cost savings afforded by the adaptability of the basic circuit board.

Manufacturers of memory modules and other microelectronic device assemblies commonly test each module before it is shipped. If one of the integrated circuit dies mounted on the module is defective, the entire module may need to be discarded. In U.S. Pat. No. 5,953,216, the teachings of which are incorporated herein by reference, Farnworth et al. propose an apparatus and method for substituting a replacement device (e.g., a new integrated circuit die) for a defective component (e.g., a defective integrated circuit die). In accordance with this method, the defective component may be isolated by severing electrical connections between the component and the circuit board or the like to which the defective component is mounted. The replacement component may be attached to a replacement site on the circuit board and coupled to a dedicated replacement terminal on the circuit board, e.g., by wirebonding. Farnworth et al. employ a circuit board that includes a replacement site for all of the modules produced, including the majority of the modules that do not include any defective components. Leaving an empty replacement site in defect-free modules may be undesirable in some circumstances.

SUMMARY

Embodiments of the invention provide actuatable traces for microelectronic assemblies, selectively configurable circuit boards, processor-based devices employing selectively configurable circuit boards, and methods of selectively configuring a circuit board. An actuatable trace for a microelectronic assembly in one embodiment includes a first conductive length and a second conductive length. A gap is disposed between, and electrically separates, the first and second conductive lengths and has an exposed gap surface. A fusible member is in communication with the gap. The fusible member is spaced from the first and second lengths and is formed of a fusible material which, when melted, will wet the gap surface to electrically connect the first and second conductive lengths across the gap. If so desired, the first conductive length may be formed of a first conductive material and the second conductive length may be formed of a second conductive material, with the fusible material having a melting point below the melting point of the first conductive material and the melting point of the second conductive material.

Another embodiment of the invention provides a selectively configurable circuit board. The circuit board may include a substrate and circuitry carried by the substrate. The substrate may include at least one component site for receiving a microelectronic component. The circuitry may include a plurality of selectively actuatable traces associated with the component site. At least one of the actuatable traces may comprise an actuatable trace in accordance with the previously described embodiment. In one adaptation of such a circuit board, a second one of the actuatable traces can comprise a third conductive length formed of a third conductive material, a fourth conductive length formed of a fourth conductive material, and a gap between the third and fourth conductive lengths. A fused bridge may span the gap to electrically connect the third and fourth conductive lengths. The fused bridge may be formed of a conductive material which is different from, and has a lower melting point than, the third conductive material and the fourth conductive material.

An alternative embodiment of the invention provides a selectively configurable circuit board that includes a substrate having at least one component site adapted to receive a microelectronic component. A plurality of board leads may be adapted to interface the circuit board with an external bus. A plurality of electrical connectors may be arranged adjacent the component site, with the electrical connectors being adapted to be electrically coupled to a contact of a microelectronic component which may be received at the component site. Selectively configurable circuitry may be carried by the substrate and adapted to selectively couple selected ones of the electrical connectors to selected ones of the board leads. The selectively configurable circuitry may comprise at least one trace associated with each of the electrical connectors, with at least one of the traces including a normally open thermally actuatable switch that can be selectively closed to create an electrical connection. The thermally actuatable switch may comprise a gap between two conductive lengths of the conductive trace, an exposed switch surface, and a thermally responsive member that may wet the exposed switch surface when selectively heated above an activation temperature.

A further embodiment of the invention provides a programmable computer that includes a system bus, a processor coupled to the system bus, and a selectively configured circuit board. The circuit board may comprise a substrate having at least one component site and a microelectronic component carried by the substrate at the component site, with the microelectronic component including a plurality of contacts. A plurality of board leads may be coupled to the system bus. A plurality of electrical connectors may be arranged adjacent the component site, with at least some of the electrical connectors being individually coupled to the microelectronic component contacts. A first trace may be carried by the substrate and electrically connect one of the electrical connectors to one of the board leads. The first trace may include a closed switch that comprises a normally open thermally actuatable switch that has been closed to create an electrical connection. A second trace may also be carried by the substrate and coupled to one of the electrical connectors and one of the board leads. The second trace may include an open thermally actuatable switch that can be selectively closed to create an electrical connection.

Still another embodiment of the invention provides a method of manufacturing a microelectronic device assembly including a microelectronic component and a circuit board. Each of a plurality of component contacts of the microelectronic component may be electrically coupled to one of a plurality of board contacts carried by the circuit board. The circuit board may carry a plurality of configurable traces associated with the board contacts and each of the configurable traces may include at least one normally open thermally actuatable switch. A first normally open actuatable switch is identified from the plurality of normally opened thermally actuatable switches. The first switch may be locally heated to selectively close the first switch to define an electrical pathway between at least one of the board contacts and at least one of a plurality of board leads the carried by the circuit board.

BRIEF DESCRIPTION OF THE DRAWINGS

FIGS. 4A–E schematically illustrate stages in the manufacture of a thermally actuatable switch in accordance with one embodiment of the invention.

FIG. 4F is a top elevation view of the thermally actuatable switch of FIG. 4E.

DETAILED DESCRIPTION

Figure 1:
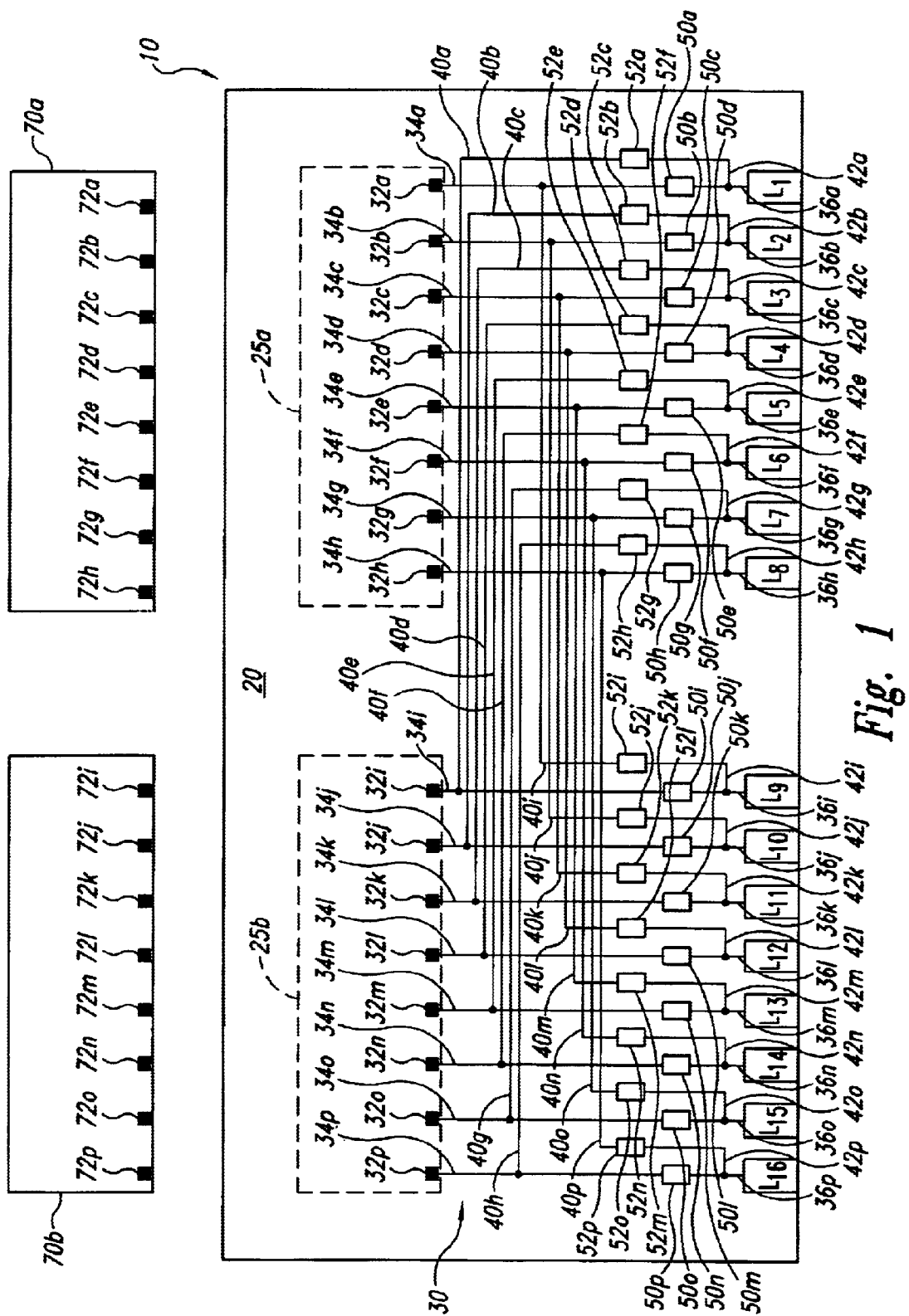
FIG. 1 is a schematic illustration of a selectively configurable circuit board in accordance with one embodiment of the invention.

Various embodiments of the present invention provide selectively configurable circuit boards, actuatable traces for microelectronic assemblies, processor-based devices employing such circuit boards, and methods of selectively configuring a circuit board. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Selectively Configurable Circuit Boards

FIG. 1 is a schematic illustration of a selectively configurable circuit board 10 in accordance with one embodiment of the invention. This embodiment includes a substrate 20 carrying circuitry 30 adapted to selectively interconnect selected board contacts 32$a$–$p$ with selected board leads $L_{1-16}$. The substrate 20 may be flexible or rigid and have any desired configuration. The substrate 20 may be formed of materials commonly used in microelectronic substrates, such as ceramic, silicon, glass, or combinations thereof. The substrate 20 can alternatively be formed of an organic material or the like commonly employed for printed circuit boards (PCBs). In one embodiment of the invention, the substrate 20 comprises a printed circuit board such as an FR-4 PCB. The size and shape of the substrate 20 can be varied as desired. For example, the substrate 20 may conform to industry standard specifications for a SIMM or DIMM.

The substrate 20 also includes one or more component sites 25, each of which may be adapted to receive a microelectronic component 70. In the illustrated embodiment, the substrate 20 includes a first component site 25$a$ and a second component site 25$b$. The first component site 25$a$ may be adapted to receive a first microelectronic component 70$a$ and the second component site 25$b$ may be adapted to receive a second microelectronic component 70$b$.

A plurality of board contacts 32 may be arranged adjacent to each of the component sites. In the particular embodiment shown in FIG. 10, which may comprise a standard 16-pin DIMM, each of the component, sites 25$a$–$b$ is associated with eight board contacts 32. Hence, the first component site 25$a$ is associated with a first set of eight board contacts 32$a$–$h$ and the second component site 25$b$ is associated with a second set of board contacts 32$i$–$p$. Each of the board contacts 32 is adapted to be electrically coupled to a component contact 72 of one of the microelectronic components 70. Hence, the first set of board contacts 32a–h may be adapted for electrical coupling to the component contacts 72a–h, respectively, of the first microelectronic component 70a. Similarly, the board contacts 32i–p of the second component site 25b may be adapted for electrical coupling to the component contacts 72i–p, respectively, of the second microelectronic component 70b. The board contacts 32-a–p may take any desired form. For example, the board contacts 32a–p may comprise holes and the component contacts 72a–p may comprise pins received in the holes. Alternatively, the board contacts 32a–p may comprise bond pads of the type commonly used in wirebonding or flip chip bonding. The board contacts 32 shown in FIG. 1 are arranged along a single edge of their respective component sites 25. It should be recognized that this is merely for purposes of illustration and the board contacts 32 may be arranged in an array within the component sites 25 (e.g., where flip chip bonding is used), around the periphery of the component sites 25 (e.g., where wirebonding is to be used), or in any other suitable arrangement.

As noted above, the circuit board 10 of FIG. 1 may be used as the circuit board of a 16-pin DIMM. The circuit board 10 includes sixteen board leads $L_{1-16}$, which may be arranged in two sets of eight leads ($L_{1-8}$ and $L_{9-16}$). In conventional circuit boards (not shown), an individual board contact 32 would be directly wired to a specific one of the board leads L by a single conductor carried by the substrate. In the embodiment of FIG. 1, however, none of the board contacts 32 are electrically connected to any of the board leads L. Instead, the circuitry 30 which can be used to connect the board contacts 32 to the leads L includes a series of short circuit traces which may be actuated to selectively connect specific board contacts 32 to specific desired leads L as the situation demands.

Each of the board contacts 32a–p may be coupled to a separate contact trace segment 34a–p, respectively. Similarly, each of the leads $L_{1-16}$ may be coupled to a lead trace segment 36a–p, respectively. In the initial state shown in FIG. 1, none of the contact trace segments 34 are electrically connected to any of the lead trace segments 36. Instead, a normally open thermally actuatable first switch 50 is disposed between each of the contact trace segments 34 and at least one of the lead trace segments 36. In the particular embodiment shown in FIGS. 1–3, sixteen first switches 50a–p are employed, with each of the first switches 50a–p being disposed between and electrically separating one of the contact trace segments 34a–p from one of the lead trace segments 34a–p, respectively. Hence, the open first switch 50a is disposed between the contact trace segment 34a and the lead trace segment 36a and serves to divide the trace between the connector 32a to the lead L into the two electrically separate trace segments.

The illustrated circuit board 10 further includes a set of normally open thermally actuatable second switches 52a–p. Each board contact 32 and each lead L is associated with one of the first switches 50 and with one of the second switches 52. As shown in FIG. 1, a plurality of alternative contact trace segments 40a–p may provide a conductive path from one of the second switches 52a–p, respectively, to one of the board contacts 32. A first set of the second switches 52a–h is associated with the second set of board contacts 32i–p, respectively, whereas a second set of the second switches 52i–p are associated with the first set of board contacts 32a–h, respectively. A series of alternative lead trace segments 42a–p may provide a conductive path from each of the board leads $L_{1-16}$ to one of the second switches 52a–p, respectively.

Figure 2:
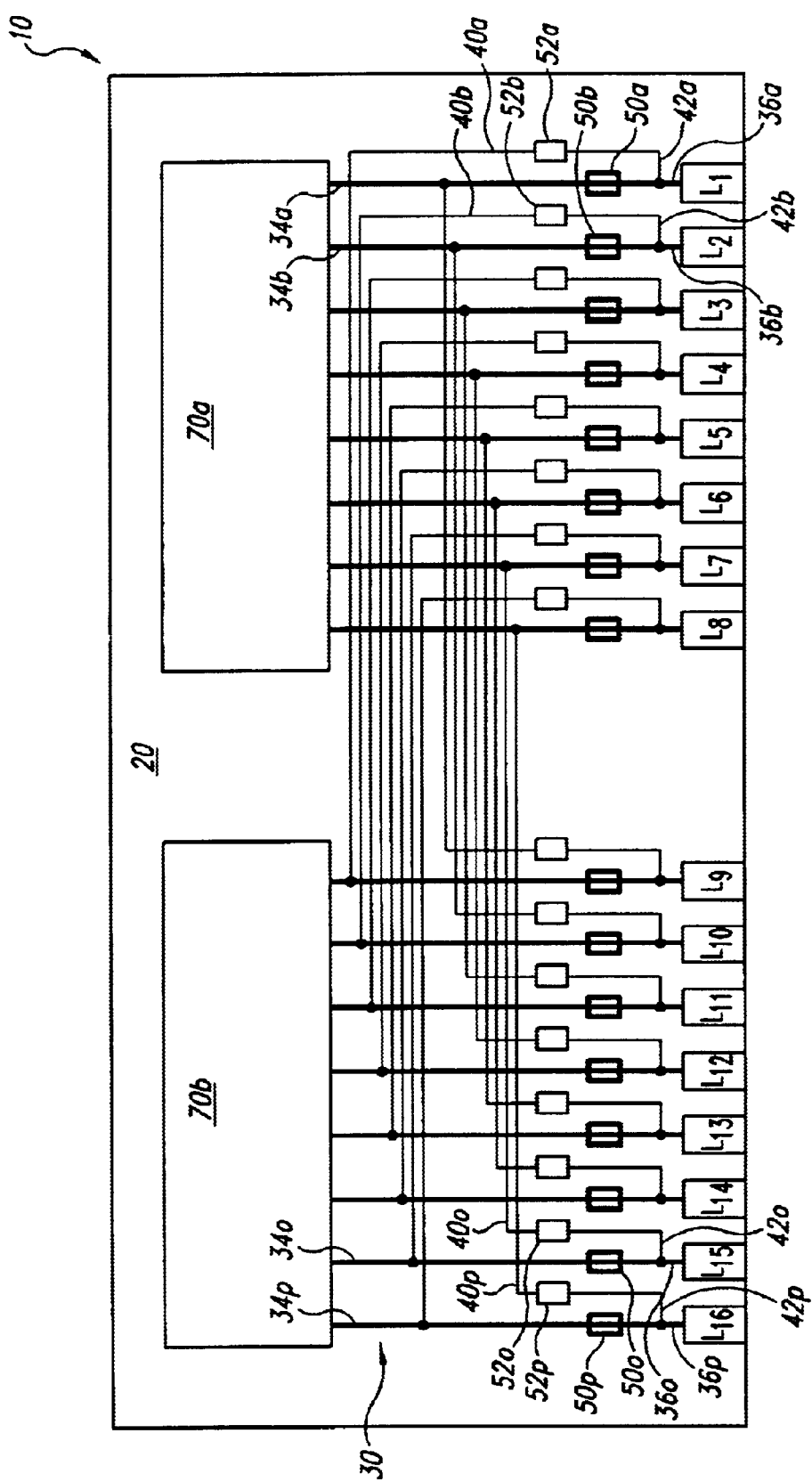
FIG. 2 is a schematic illustration of the selectively configurable circuit board of FIG. 1 in a first configuration.

FIG. 2 schematically illustrates the circuit board 10 of FIG. 1 with the microelectronic components 70a–b received at one of the component sites 25a–b (shown in FIG. 1, but not visible in FIG. 2). Although not shown in FIG. 2, each of the component contacts 72 of the microelectronic components 70 may be electrically coupled to one of the board contacts 32 of the board circuitry 30.

Each of the first switches 50 in the microelectronic device assembly of FIG. 2 has been selectively closed, while each of the second switches 52 remains in its normally open state. As a result, each of the contact trace segments 34a–p is electrically connected to one of the lead trace segments 36a–p, respectively, by one of the first switches 50a–p, respectively. This defines a plurality of traces which couple the first microelectronic component 70a to the first set of board leads $L_{1-8}$ and couple the second microelectronic component 70b to the second set of board leads Lows. This is in keeping with the conventional connection of a pair of integrated circuit dies to the leads on an edge connector in a conventional DIMM.

Figure 3:
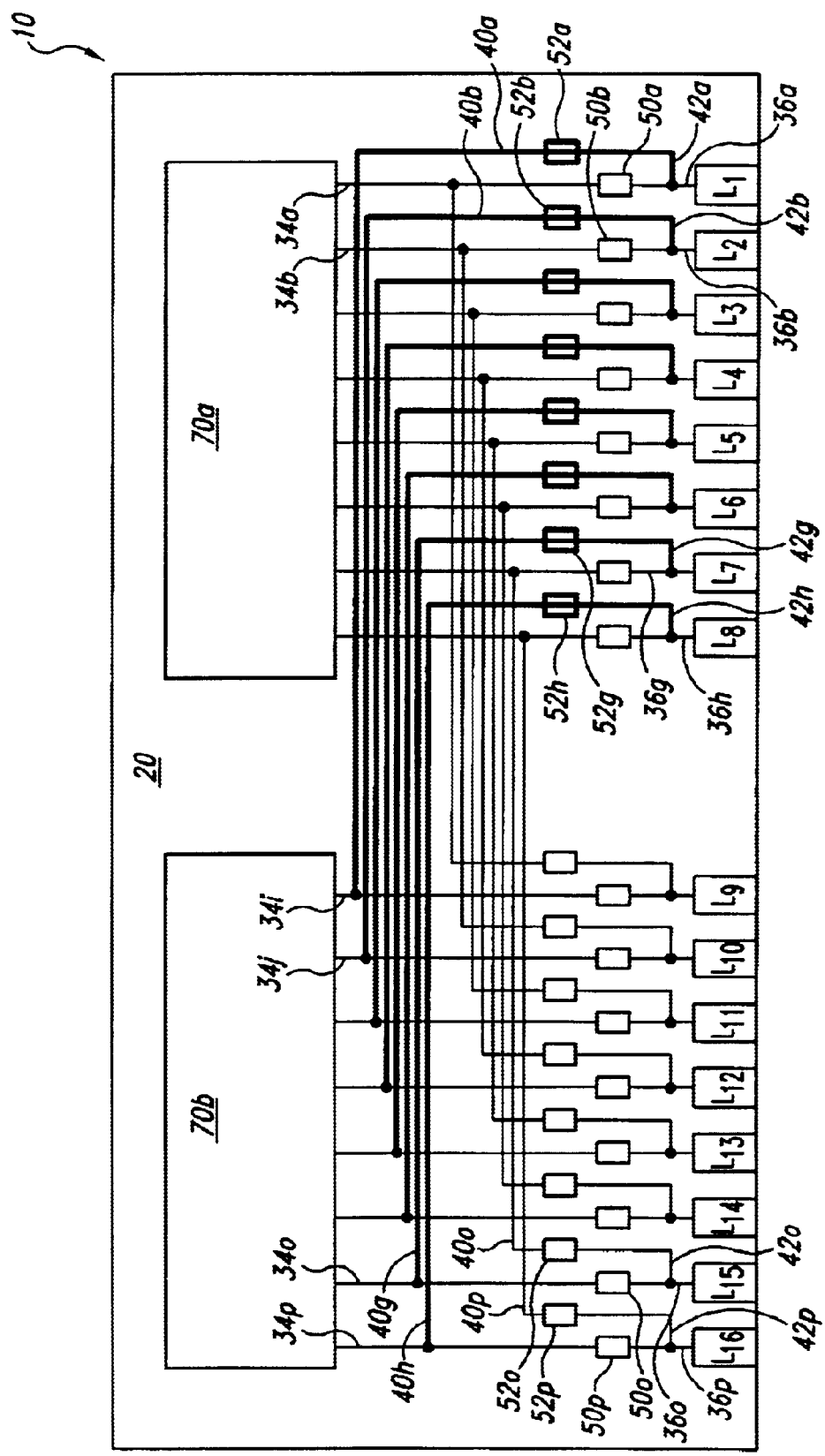
FIG. 3 is a schematic illustration of the selectively configurable circuit board of FIG. 1 in a second configuration.

In the configuration shown in FIG. 3., the microelectronic components 70 are mounted to the substrate 20, as in FIG. 2. However, each of the first switches 50 remains in its open state in FIG. 3. The first set of second switches 52a–h has been selectively closed, but the remainder of the second switches 52 remains open. As a result, the alternative lead traces 42a–h are electrically connected to the alternative contact traces 40a–h. This, in turn, serves to electrically couple the component contacts 72i–p (FIG. 1) of the second microelectronic component 70b to the first set of board leads $L_{1-6}$. Because the remainder of the second switches 52 and all of the first switches 50 remain in their normally open state, the first microelectronic component 70a remains electrically isolated, i.e., it is not electrically coupled to any of the board leads L.

The configuration shown in FIG. 3 may be advantageous if the first microelectronic component 70a is defective. For example, in manufacturing a 16-pin DIMM, the first integrated circuit die or integrated circuit package 70a may be determined to be defective. If a conventional circuit board were employed, the entire DIMM would have to be scrapped. The second integrated circuit die 70b may be entirely functional, but it is connected to the second set of leads $L_{9-16}$, because the computer will first address the first set of leads $L_{1-6}$, which are connected to the defective die 70a, the module would not operate properly.

Rather than scrapping every DIMM having a defective die 70a, the configuration of FIG. 3 enables the manufacturer to connect the first eight pins (leads $L_{1-6}$) to the second die 70b. With the defective die 70a isolated on the circuit board 10, the product shown in FIG. 3 may be utilized as a conventional 8-pin memory module. While the 8-pin module may sell for less than the intended 16-pin product, this is still an appreciable improvement over scrapping the entire DIMM because of a single defective integrated circuit die.

FIGS. 1–3 illustrate one particular embodiment of the invention which may be useful in manufacturing DIMMs. One of ordinary skill in the art will recognize, though, that the flexibility afforded by the selectively configurable circuitry 30 need not be limited to the particular application shown. FIGS. 1–3 illustrate a relatively simple embodiment wherein each of a series of electrical connectors 32 may be selectively connected to each of two different electrical leads L. It should be readily apparently to one skilled in the art that the principles of the invention need not be so limited, however, and the possible circuitry can be increased significantly by increasing the number of switches and alternative traces associated with any particular electrical contact or lead.

Thermally Actuatable Switches

As noted above, embodiments of the invention employ thermally actuatable switches. In the embodiment of FIGS. 1–3, these thermally actuatable switches permit the circuitry 30 of the circuit board 10 to be selectably configured as desired to connect board contacts 32 to board leads L in a desired arrangement. These thermally actuatable switches are normally open, i.e., do not provide a conductive path thereacross. By thermally actuating a particular switch, however, the switch can be selectively closed to define a conductive path across the switch. This can be used to connect selected contact trace segments 34 to selected lead VA trace segments 36, for example. Each of the switches may be adapted to be individually closed in response to a localized thermal stimulus without necessitating closure of any other switch. This provides a great deal of flexibility in configuring the circuitry 30.

FIGS. 4A–F illustrate a thermally actuatable switch 50 in accordance with one embodiment of the invention. FIGS. 4A–F illustrate one of the first switches 50 of FIGS. 1–3, but this should not be deemed as overly limiting. If so desired, the second switches 52 shown in FIGS. 1–3 may have the same design and be formed in the same manner shown in FIGS. 4A–F. Additionally, the various thermally actuatable switches shown in FIGS. 4–9 can be utilized in a variety of different applications and need not be limited to the particular design shown in FIGS. 1–3 or discussed above.

FIG. 4A shows an initial stage in the manufacture of a thermally actuatable switch 50. This initial stage includes a substrate 20 with a first conductive trace segment 34 and a second conductive trace segment 36 carried on an exterior surface of the substrate 20. These trace segments 34 and 36 are spaced from one another by a nonconductive gap 80. A portion of the exterior surface 22 of the substrate 20 defines an exposed gap surface or switch surface 82 between the trace segments 34 and 36. For reasons explained below, it may be desirable to provide a wetable coating 83 on the gap surface 82 to enhance performance of the switch 50.

Using conventional photoresist techniques, a resist layer 85 may be applied over the exterior surface 22 of the substrate 20 and the conductive trace segments 34 and 36 (FIG. 4B). This photoresist layer can be treated and selectively stripped to expose a portion of the gap surface 82 (FIG. 4C). employing known processes. A portion of the photoresist desirably remains within the gap 80. In particular, a first lateral thickness 85a of the resist layer is disposed between the first trace segment 34 and the gap 80. Similarly, a second lateral thickness 85b of the resist layer is disposed between the second trace segment 36 and the gap 80.

As shown in FIG. 4D, a thermally responsive member 90 may be deposited in the gap 80 to span the distance between the two lateral thicknesses 85a–b of the resist layer 85. Thereafter, the remaining resist layer 85 may be stripped, leaving a first gap portion 80a between the thermally responsive member 90 and the first conductive trace segment 34 and a second gap portion 80b between the thermally responsive member 90 and the second conductive trace segment 36. As shown in FIGS. 4E–F, a first gap surface portion 82a is exposed by the first gap portion 80a and a second gap surface portion 82b is exposed by the second gap portion 80b.

The first gap segment 80a may have a width $W_a$ approximately equal to the first lateral thickness 85a of the resist layer 85 (FIG. 4D) and the second gap portion 80b may have a width $W_b$ approximately equal to the second lateral thickness 85b. The widths $W_a$ and $W_b$ between the thermally responsive member 90 and the adjacent trace segments 34 and 36 should be sufficient to avoid any meaningful electrical conductivity between the trace segments 34 and 36 via the thermally actuatable member 90, such as by arcing across the gap portions. 80a–b. In one embodiment, the two widths $W_a$ and $W_b$ are approximately the same. Widths W of about 20–100 microns, e.g., about 50 microns, are expected to be suitable.

The dimensions of the elements of the thermally actuatable switch can be varied depending on the particular application. In one embodiment, the distance between the conductive trace segments 34 and 36 (i.e., the width of the gap 80 in FIG. 4A) is between about 0.5 and about 2.0 millimeters. The thickness (T in FIG. 4A), of the trace segments 34 and 36 may be on the order of about 12–18 microns, e.g., about 12–15 microns. The thermally responsive member 90 may have a thickness which is the same as the thickness of the trace segments 34 and 36. It may be possible to utilize a thermally responsive member 90 which is mp thicker than the traces 34 and 36, but in one embodiment of the invention the thermally responsive member 90 is no thicker than the trace segments 34 and 36. Prior to thermal actuation (i.e., as shown in, FIGS. 4E–F), the thermally responsive member 90 in this embodiment of the invention has a thickness no greater than the thickness T of the trace segments 34 and 36, e.g., about 12–15 microns.

Figure 5:
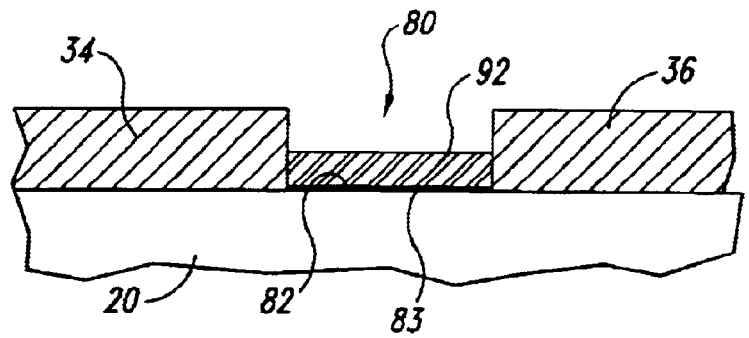
FIG. 5 is a schematic illustration of the thermally actuatable switch of FIG. 4E after it has been thermally actuated to create an electrical connection.
Figure 6:
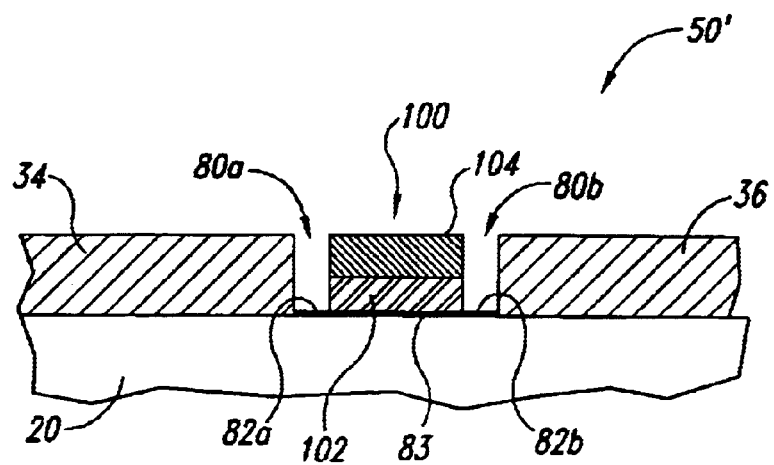
FIG. 6 is a schematic cross-sectional illustration of a thermally actuatable switch in accordance with an alternative embodiment of the invention.

The trace segments 34 and 36 of the switch 50 shown in FIGS. 4 and 5 can be formed of any suitable conductive material and may be arranged on the substrate in any appropriate fashion. The first trace segment 34 may be formed of a first conductive material and the second trace segment 36 may be formed of a second conductive material. In one embodiment, the first and second conductive materials are different from one another. In another embodiment, the first and second conductive materials are the same material. For example, the first and second conductive traces 34 and 36 may be formed of copper or a copper alloy applied to the exterior surface 22 of the substrate 20. A number of techniques for forming such traces from a variety of conductive materials are well-known in the PCB manufacturing arts.

The thermally responsive member 90 is formed of a thermally responsive material which is adapted to wet the exposed switch surface 82 when selectively heated above an activation temperature. The activation temperature may comprise a temperature at which the thermally responsive material becomes flowable so it can span the gap between the two conductive trace elements 34 and 36.

FIG. 5 illustrates the thermally actuatable switch 50 after it has been thermally actuated to close the switch 50. The thermally responsive member 90 of FIGS. 4E–F has been heated above its activation temperature and has flowed to span the entire width of the gap 80 between the trace segments 34 and 36. This forms a conductive fused bridge 92 which electrically connects the two trace segments 34 and 36 to form a longer conductive trace.

In one embodiment, the thermally responsive material is a fusible material and the thermally responsive member 90 may be referred to as a fusible member 90. In one embodiment, the actuation temperature comprises a melting temperature of such a fusible material. In another embodiment, the activation temperature comprises a glass transition temperature $T_g$ of the fusible material. The activation temperature is desirably less than the melting point of the conductive material(s) of which the conductive trace segments 34 and 36 are formed. This permits the thermally responsive member 90 to be heated sufficiently to flow and close the switch 50, as shown in FIG. 5, without unduly damaging or melting the conductive trace segments 34 and 36. In another embodiment, the activation temperature is no greater than a melting point of the substrate 20 or a temperature at which the thermally responsive material would react with the substrate 20. This temperature may be higher or lower than the melting point of the conductive materials used in the trace segments 34 and 36. In one embodiment, the activation temperature is no greater than 300° C.

In manufacturing some microelectronic device assemblies, microelectronic components are mounted to a circuit board by reflowing an eutectic solder. In embodiments of the invention employing eutectic solder to mount microelectronic components 70 to a circuit board 10, the activation temperature of the thermally responsive member 90 may be greater than the melting point of the eutectic solder. This permits the entire microelectronic device assembly to be heated sufficiently to cause the eutectic solder to reflow and mount the components without actuating the switches. Some eutectic solders known in the art have melting points of 220° C. or less. One embodiment of the invention, therefore, employs a thermally responsive material having an activation temperature of at least about 220° C. In one particular embodiment, the activation temperature is between about 220° C. and about 300° C. In another embodiment, the activation temperature is about 240–300° C.

Materials which are believed to be suitable include metals, metal alloys, and conductive organic materials. For example, metals and metal alloys having melting points between about 220° C. and about 300° C. include tin, high lead solders, high tin solders, lead-free solders, and other metal alloys. If so desired, the thermally responsive member 90 may be coated with an organic solderability preservative (OSP), a variety of which are commercially available from a number of sources.

The material of the thermally responsive member 90 may sufficiently wet the exposed surface 22 of the substrate 20 to readily wet the gap surface portions 82a–b and electrically connect the trace segments 34 and 36. The wetability of this interface may be improved, however, by providing a wetable coating 83 which is more readily wetted by the material of the thermally responsive member 90 as it flows. The wetable coating 83 may, for example, comprise a metal. In one embodiment, the wetable coating 83 comprises a thin coating of gold. It is anticipated that a thin flash coating would suffice to improve wetability without creating any unintended electrical connection between the trace segments 34 and 36.

Figure 7:
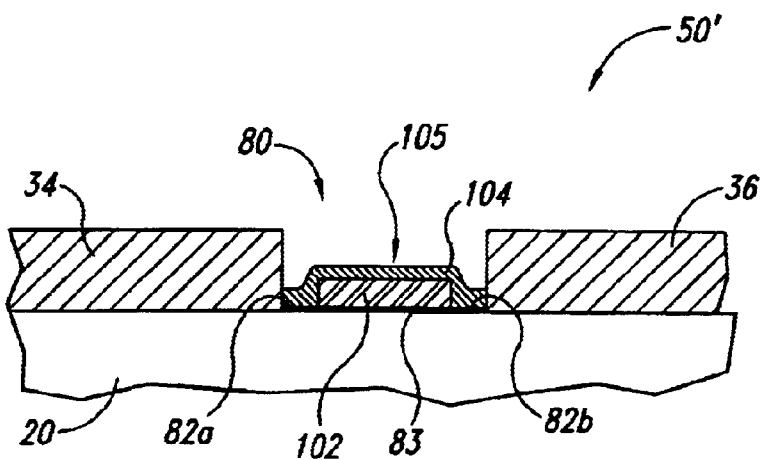
FIG. 7 is a schematic cross-sectional illustration of the thermally actuatable switch of FIG. 6 after it has been closed to create an electrical connection.

In the embodiment of FIGS. 4 and 5, the thermally responsive member 90 is shown as being a single monolithic structure. In an alternative embodiment shown in FIGS. 6 and 7, thermally actuatable member 100 comprises two or more layers. In the illustrated embodiment, the thermally actuatable member 100 comprises a wetable base 102 and a thermally responsive cap 104. The base may be formed of a material which has an activation temperature the same as or less than the activation temperature of the fusible cap 104. In another embodiment of the invention, however, the wetable base 102 will remain substantially solid and will not flow when the fusible cap 104 is heated to its activation temperature. This permits the fusible cap 104 to flow to cover the exposed gap surface segments 82a–b while leaving the wetable base 102 substantially intact. FIG. 7 illustrates such a structure after the thermally responsive member 100 has been thermally actuated to form a fused bridge 105 across the entire width of the gap 80.

In one embodiment, the wetable base 102 may comprise copper or gold and the fusible cap 104 may comprise one of the materials noted above or the fusible material of the thermally responsive member 90 of FIGS. 4 and 5. In another embodiment (not shown), the fusible cap 104 may comprise two or more layers. For example, the thermally responsive member 100 may comprise a copper or gold base 102 carrying a first layer of one of the fusible materials noted above in connection with the thermally responsive member 90, and a second layer of gold over the first layer. The gold can help protect the underlying material of the fusible cap from oxidation and the like, reducing or eliminating the need for an OSP.

In the embodiments of FIGS. 4–7, the trace segments 34 and 36 and the gap surface 82 are exposed, outer surfaces of the circuit board (10 in FIG. 1). FIGS. 8–9 illustrate another embodiment of the invention wherein the circuit board comprises a laminate structure having a substrate 20, a layer of selectively configurable circuitry (only conductive trace segments 34 and 36 being shown) and an upper layer 130. The upper layer 130 may comprise any suitable material. In one embodiment, the substrate 20 and the upper layer 130 are formed of the same material, but other laminate pairings known in the art could be used.

Figure 8A:
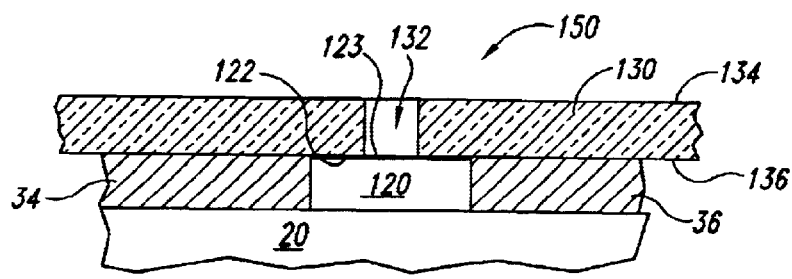
FIGS. 8A–B schematically illustrate stages in the manufacture of a thermally actuatable switch in accordance with another embodiment of the invention.
Figure 8B:
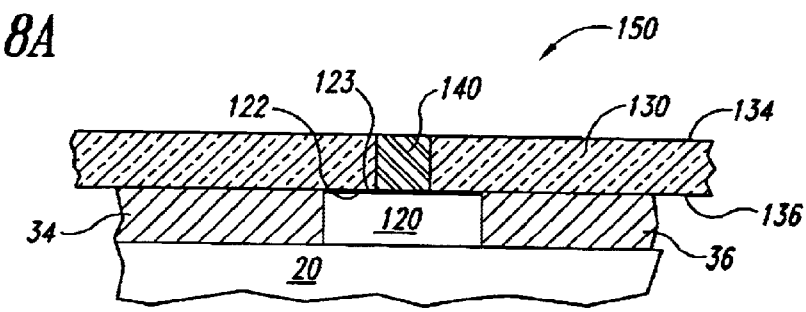
Figure 9:
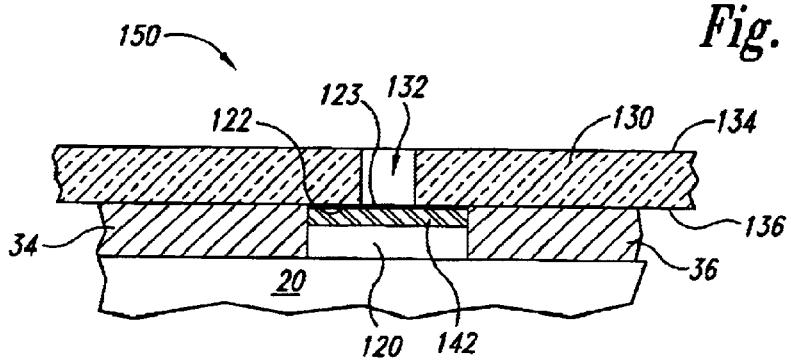
FIG. 9 is a schematic illustration of the thermally actuatable switch of FIG. 8B after it has been thermally actuated to create an electrical connection.

FIGS. 8A–B illustrate sequential stages in one process for manufacturing the thermally actuatable switch 150 of this embodiment. As shown in FIG. 8A, the upper layer 130 may be brought into contact with an upper service of the trace segments 34 and 36 to generally enclose a gap 120. An orifice 132 may be defined in the upper layer 130. The orifice may be open and pass entirely through the thickness of the upper layer 130, providing a passage between the exposed surface 134 and the contact surface 136 of the upper layer 130. The orifice 132 can be sealed, however, so long as it is in communication with the gap 120.

The orifice 132 may be formed in the upper layer 130 before the upper layer 130 is brought into contact with the connective trace segments 34 and 36 as shown in FIG. 8A. In an alternative embodiment, though, the orifice 132 is formed after the upper layer 130 is in position. This may be done, for example, by laser machining.

A portion of the contact surface 136 of the upper layer 130 is exposed to the gap 120, defining a wetable gap surface 122. As so desired, this gap surface 122 may be provided with a wetable coating 123 substantially the same as the wetable coating 83 discussed above. As shown in FIG. 8B, the orifice 132 may carry a thermally responsive member 140 formed of a thermally responsive material. In one embodiment, the thermally responsive member 140 substantially fills the orifice 132 and extends between the exposed surface 134 and the contact surface 136 of the upper layer 130. This thermally responsive member 140 may be positioned in the orifice 132 in any desired fashion, such as by known plating techniques. The thermally responsive material may be added to the orifice 132 after the upper member 130 is in position atop the trace segments 34 and 36, as illustrated in FIGS. 8A–B. In an alternative embodiment, the thermally responsive member 140 is created in the upper layer 130 before the upper layer 130 is assembled with the substrate 20 to create the thermally actuatable switch 150.

FIG. 9 illustrates the thermally actuatable switch 150 after it has been thermally actuated. The thermally responsive member 140 of FIG. 8B has flowed to wet the gap surface 122. This defines a fused bridge 142 which spans the width of the gap 120 to electrically connect the trace segments 34 and 36.

In the embodiment of FIGS. 4–7, the thermally responsive member 90 or 100 is physically positioned within the gap 80 between the conductive trace segments 34 and 36. This places the thermally responsive member in communication with the gap so it may readily wet the gap surface 82. The embodiment of FIGS. 8 and 9 illustrate that physically positioning the thermally actuatable member 140 within the gap 120 is not necessary, though. This thermally responsive member 140 is actually positioned outside the gap 120. The thermally actuatable member 140 is still in communication with the gap and with the exposed gap surface 122, though. Consequently, when it is heated above its activation temperature, it can flow to form a fused bridge 142, as shown in FIG. 9.

Processor-Based System

Figure 10:
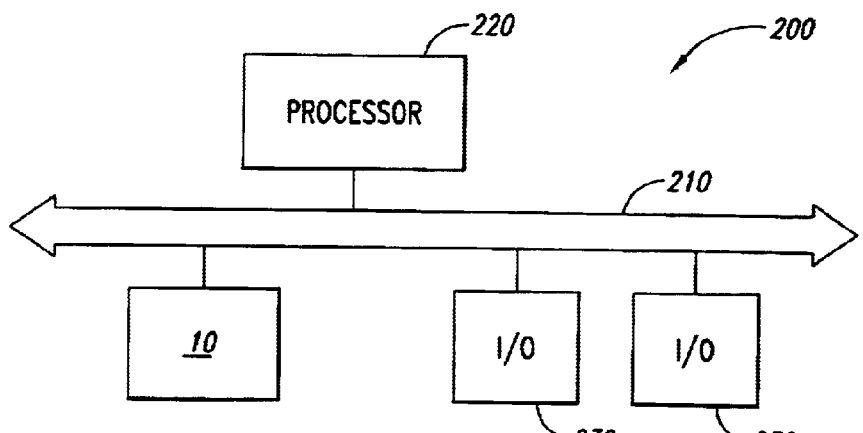
FIG. 10 is a schematic illustration of a processor-based system in accordance with a further embodiment of the invention.

FIG. 10 illustrates a processor-based system in accordance with one embodiment of the invention. The processor-based system 200 may comprise a conventional personal computer, a portable computing device, a cellular telephone, or any other system which employs a processor. The processor-based system 200 includes a processor 220 in communication with a system bus 210.

One or more input/output devices 230 may be in communication with the system bus 210. The system bus 210 is also in communication with a selectively configured circuit board 10 in accordance with an embodiment of the present invention. The selectively configured circuit board may comprise a DIMM generally as shown in FIGS. 1–3. As shown in FIG. 2, for example, such a selectively configured circuit board may include a plurality of closed thermally actuatable switches 50a–p and a plurality of open thermally actuatable switches 52. The selectively configured circuit board 10 may communicate with the system bus 210 via the board leads $L_{1-16}$ (FIGS. 1–3).

Methods of Manufacturing Microelectronic Device Assemblies

Embodiments of the present invention provide methods for manufacturing microelectronic device assemblies which include a microelectronic component and a circuit board. In the following discussion, reference is made to the embodiment shown in FIGS. 1–5. It should be understood that this is merely for ease of understanding, though, and that methods of the invention need not be limited to the particular structures shown in these drawings.

In accordance with an embodiment of the invention, one or more microelectronic components 70 and a circuit board 10 are provided. Each of a plurality of component contacts 72 on the microelectronic component(s) 70 are connected to one of a plurality of board contacts 32 carried by the circuit board 10. A first one of the normally open thermally actuatable switches 50a–p or 52a–p may be identified for selective closure. The first switch, e.g., switch 50a, may be locally heated to selectively close the switch 50a. This defines an electrical pathway between the board contact 32a and the board lead $L_1$.

The thermally actuatable switch 50a may be selectively closed by heating the thermally responsive member 90 of the switch 50a and causing it to flow, as discussed above. The heating may be carried out in any suitable fashion. Desirably, though, the switches 50 and 52 are adapted to be individually closed in response to a localized thermal stimulus without necessitating closure of any other thermally actuatable switch. For example, the thermally responsive member 90 may be selectively heated by a laser or other focused heat source to a temperature above its activation temperature. The thermally responsive member 90 will then flow to wet the gap surface 82 to define an electrically conductive path between the two conductive trace segments 34 and 36.

Either thereafter or simultaneously, each of the other switches 50 or 52 which have been identified for closure can be locally heated to yield the desired final circuitry 30.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A selectively configurable circuit board, comprising:
   a substrate having at least one component site adapted to receive a microelectronic component;
   a plurality of board leads adapted to interface the circuit board with an external bus;
   a plurality of board contacts arranged adjacent the component site, each of the board contacts being adapted to be electrically coupled to a component contact of a microelectronic component which may be received at the component site; and
   selectively configurable circuitry carried by the substrate and adapted to selectively couple selected ones of the board contacts to selected ones of the board leads, the selectively configurable circuitry comprising at least one trace associated with each of the electrical connectors, at least one of the traces including a normally open thermally actuatable switch which can be selectively closed to create an electrical connection.

2. The selectively configurable circuit board of claim 1 wherein the thermally actuatable switch comprises a gap between two conductive lengths of the conductive trace and a thermally responsive member.

3. The selectively configurable circuit board of claim 1 wherein the thermally actuatable switch comprises a gap between two conductive lengths of the conductive trace, an exposed switch surface, and a thermally responsive member.

4. The selectively configurable circuit board of claim 3 wherein the thermally responsive member is formed of a thermally responsive material which will wet the exposed switch surface when selectively heated above an activation temperature.

5. The selectively configurable circuit board of claim 4 wherein the activation temperature comprises a melting point of the thermally responsive material.

6. The selectively configurable circuit board of claim 4 wherein the activation temperature comprises a glass transition temperature of the thermally responsive material.

7. The selectively configurable circuit board of claim 1 wherein the thermally actuatable switch comprises a gap between a first conductive length and a second conductive length of the conductive trace, a gap surface between the first and second conductive lengths, and a fusible member, the first conductive length being formed of a first conductive material and the second conductive length being formed of a second conductive material, the fusible member being formed of a fusible material which will flow to wet the gap surface at a temperature below a melting point of the first conductive material and a melting point of the second conductive material.

8. The selectively configurable circuit board of claim 1 wherein a plurality of the traces each include a normally open thermally actuatable switch which can be selectively closed to create an electrical connection.

9. The selectively configurable circuit board of claim 1 wherein a plurality of the traces each include a normally open thermally actuatable switch which can be selectively closed to create an electrical connection, each of the thermally actuatable switches being adapted to be individually closed in response to a localized thermal stimulus without necessitating closure of any other thermally actuable switch.

10. The selectively configurable circuit board of claim 1 further comprising a closed switch in one of the traces, the closed switch comprising a normally open thermally actuatable switch which has been thermally actuated to create an electrical connection.

* * * * *

UNITED STATES PATENT AND TRADEMARK OFFICE
CERTIFICATE OF CORRECTION

PATENT NO.   : 6,740,821 B1
DATED        : May 25, 2004
INVENTOR(S)  : Tongbi Jiang et al.

It is certified that error appears in the above-identified patent and that said Letters Patent is hereby corrected as shown below:

Column 1,
Line 21, delete "w" between "of" and "microelectronic";
Line 26, delete comma between "in" and "predicting";
Line 60, "onsuming" should be -- consuming --;

Column 4,
Line 61, delete comma between "component" and "sites";

Column 5,
Line 11, "Altematively" should be -- Alternatively --;

Column 6,
Line 17, "Lows" should be -- $L_{9-16}$ --;

Column 7,
Line 17, delete "VA" between "lead" and "trace";

Column 8,
Line 10, delete period between "portions" and "80a-b";
Line 19, delete comma between "(T in FIG. 4A)" and "of";
Line 25, delete "mp" between "is" and "thicker";
Line 28, delete comma between "in" and "FIGS.";

Signed and Sealed this

Twenty-third Day of November, 2004

JON W. DUDAS
*Director of the United States Patent and Trademark Office*